(12) United States Patent
Matsuba et al.

(10) Patent No.: US 10,763,352 B2
(45) Date of Patent: Sep. 1, 2020

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Hiroshi Matsuba, Fujisawa Kanagawa (JP); Hung Hung, Kawasaki Kanagawa (JP); Tatsuya Nishiwaki, Nonoichi Ishikawa (JP); Kohei Oasa, Nonoichi Ishikawa (JP); Kikuo Aida, Nomi Ishikawa (JP)

(73) Assignees: KABUSHIKI KAISHA TOSHIBA, Tokyo (JP); TOSHIBA ELECTRONIC DEVICES & STORAGE CORPORATION, Tokyo (JP)

(*) Notice: Subject to any disclaimer, the term of this patent is extended or adjusted under 35 U.S.C. 154(b) by 14 days.

(21) Appl. No.: 16/120,109

(22) Filed: Aug. 31, 2018

(65) Prior Publication Data

US 2019/0259871 A1    Aug. 22, 2019

(30) Foreign Application Priority Data

Feb. 20, 2018  (JP) .................. 2018-027575

(51) Int. Cl.
*H01L 29/78* (2006.01)
*H01L 29/06* (2006.01)
*H01L 29/40* (2006.01)

(52) U.S. Cl.
CPC ...... *H01L 29/7813* (2013.01); *H01L 29/0615* (2013.01); *H01L 29/407* (2013.01)

(58) Field of Classification Search
CPC ............ H01L 29/7813; H01L 29/0615; H01L 29/407
See application file for complete search history.

(56) References Cited

U.S. PATENT DOCUMENTS 9,041,098 B2  5/2015  Ichinoseki
9,614,043 B2  4/2017  Azam et al.
(Continued)

FOREIGN PATENT DOCUMENTS

JP    2013-069852 A    4/2013
JP    2013-069866 A    4/2013

*Primary Examiner* — Julia Slutsker
(74) *Attorney, Agent, or Firm* — Kim & Stewart LLP

(57) ABSTRACT

A semiconductor device includes a semiconductor layer of a first conductivity type having first and second surfaces and an impurity concentration distribution in a first direction from the second surface to the first surface, a first semiconductor region of a second conductivity between the semiconductor layer and the first surface, a second semiconductor region of a first conductivity type between the first semiconductor region and the first surface side, a first trench extending from the first surface into the semiconductor layer, a first electrode located in the first trench over a first insulating film and spaced from the first semiconductor region by a first insulating film, a second electrode located in the first trench over a second insulating film, a second trench extending from the first surface into the semiconductor layer and surrounding the first trench, and a third electrode located in the second trench over a third insulating film.

14 Claims, 11 Drawing Sheets

(56) References Cited

U.S. PATENT DOCUMENTS

2015/0263110 A1    9/2015  Kawaguchi et al.
2017/0012118 A1*  1/2017  Park .................... H01L 29/7802
2017/0263718 A1*  9/2017  West .................... H01L 29/407

* cited by examiner

FIG. 1A

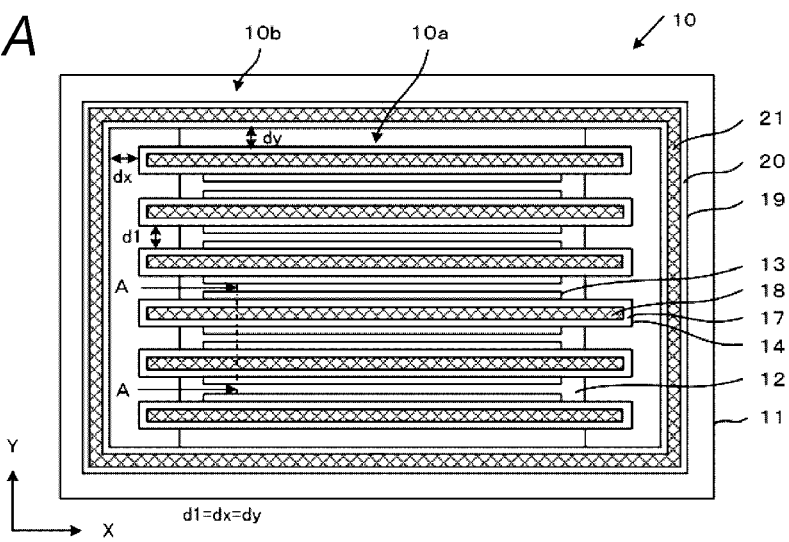

FIG. 1B

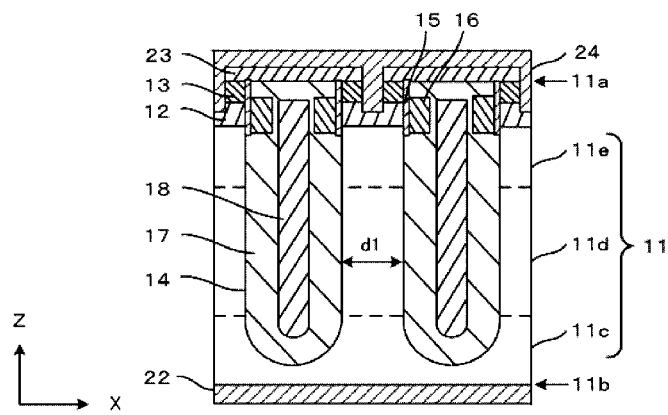

| | | |
|---|---|---|
| 10···SEMICONDUCTOR DEVICE | 15···GATE INSULATING FILM | 11a, 11b···FIRST, SECOND SURFACE |
| 10a···ACTIVE REGION | 16···GATE ELECTRODE | 11c TO 11e···FIRST TO THIRD PORTION |
| 10b···TERMINATION REGION | 22···SEMICONDUCTOR SUBSTRATE | 14, 19···FIRST, SECOND TRENCH |
| 11···SEMICONDUCTOR LAYER | 23···INTERLAYER INSULATING FILM | 17, 20···FIRST, SECOND FIELD PLATE INSULATING FILM |
| 12···p BASE REGION | 24···SOURCE ELECTRODE | |
| 13···n$^+$ SOURCE REGION | | 18, 21···FIRST, SECOND FILED PLATE ELECTRODE |

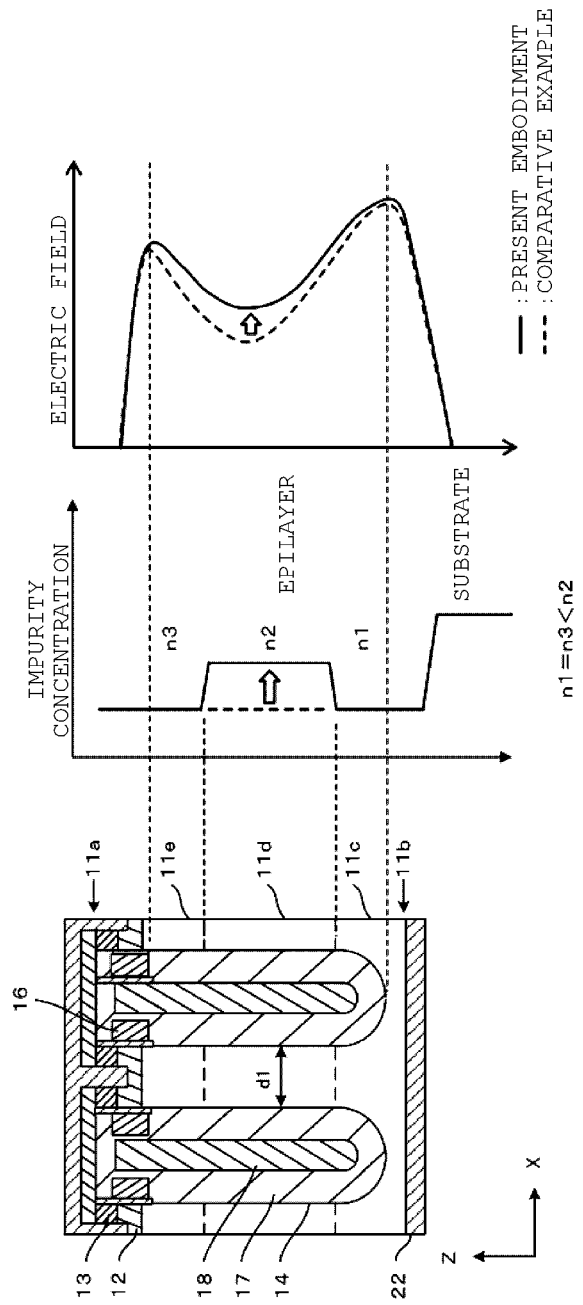

FIG. 3A
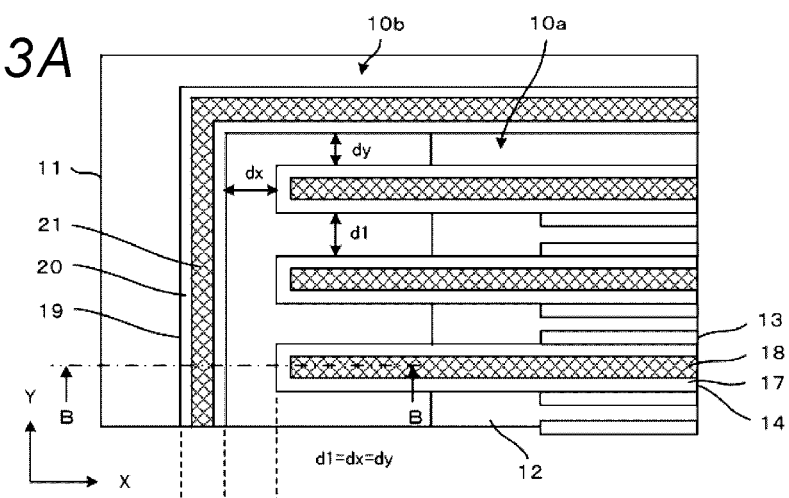
FIG. 3B
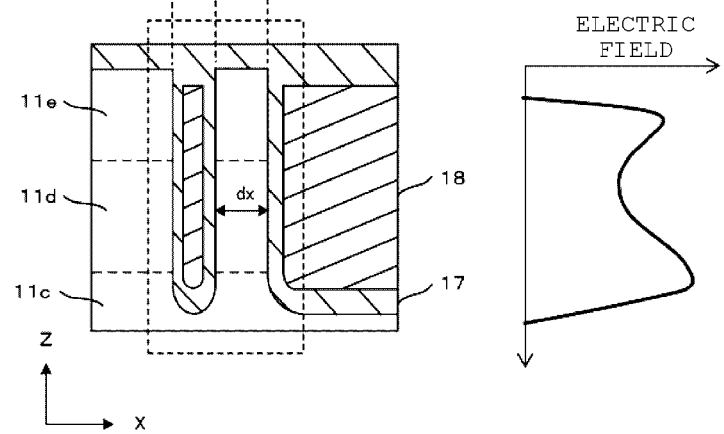
FIG. 3C
ELECTRIC FIELD

FIG. 4A
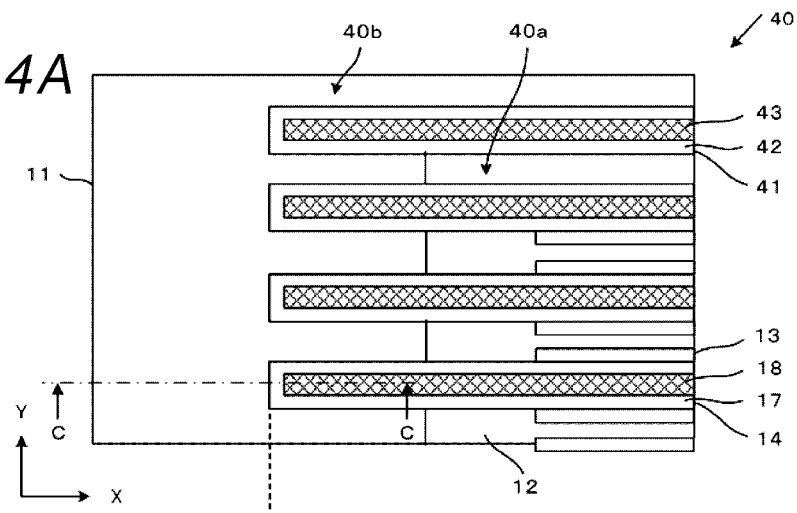
FIG. 4B
FIG. 4C
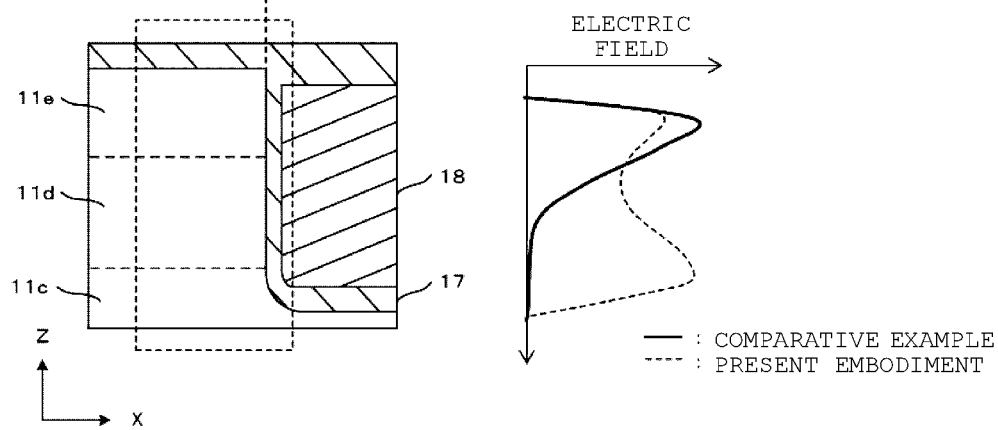
— : COMPARATIVE EXAMPLE
---- : PRESENT EMBODIMENT
40···SEMICONDUCTOR DEVICE   41···SECOND TRENCH
40a···ACTIVE REGION         42···SECOND FIELD PLATE INSULATING FILM
40b···TERMINATION REGION    43···SECOND FIELD PLATE ELECTRODE

25・・・CONTACT HOLE

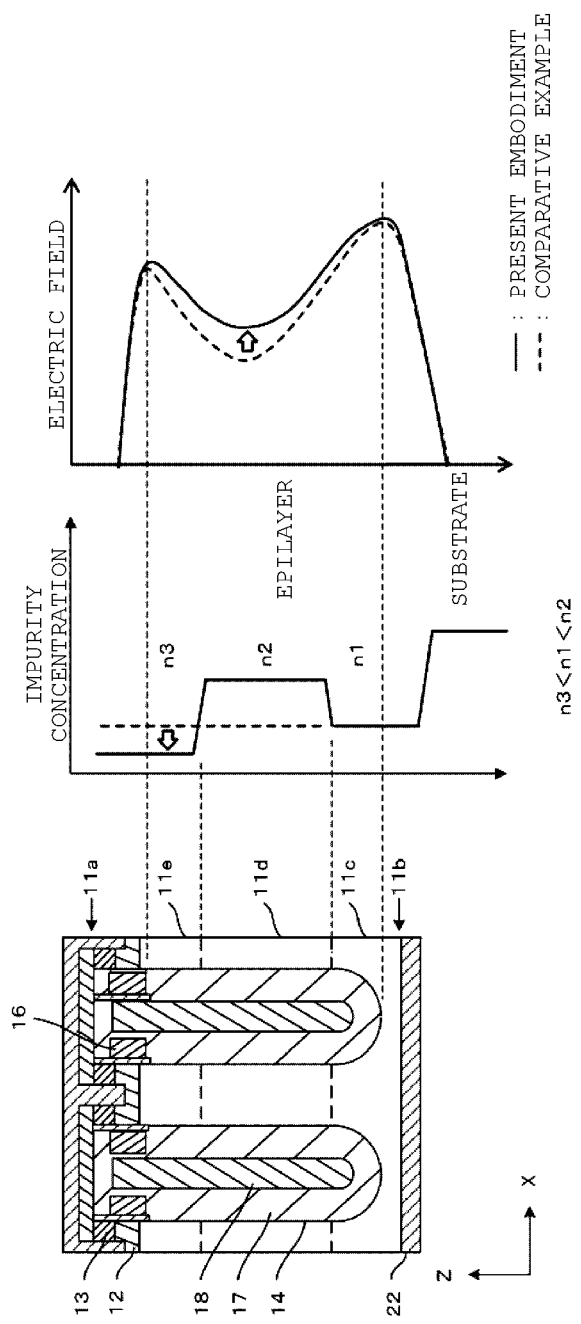

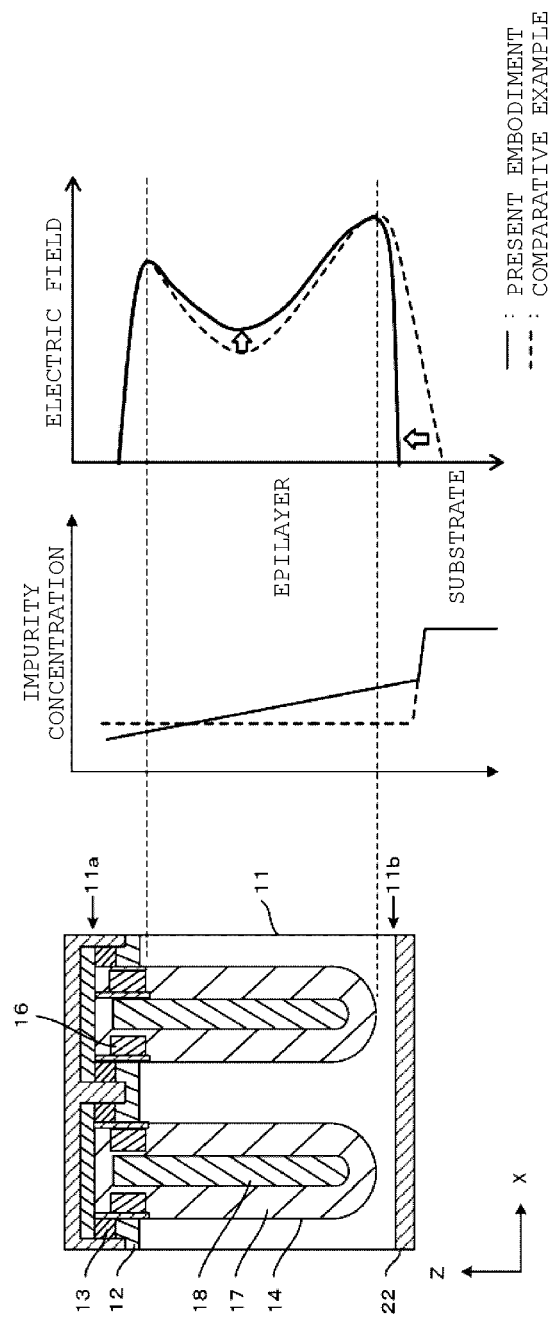

FIG. 10A
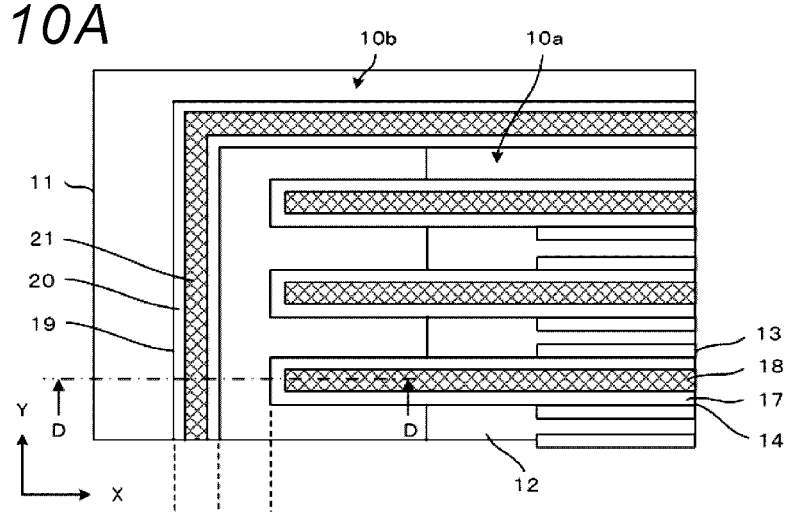
FIG. 10B
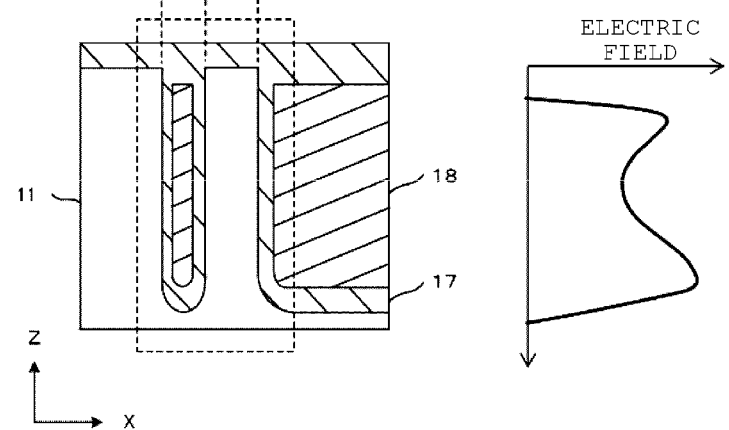
FIG. 10C

SEMICONDUCTOR DEVICE

CROSS-REFERENCE TO RELATED APPLICATION

This application is based upon and claims the benefit of priority from Japanese Patent Application No. 2018-027575, filed Feb. 20, 2018, the entire contents of which are incorporated herein by reference.

FIELD

Embodiments described herein relate generally to a semiconductor device.

BACKGROUND

A power semiconductor device is required to have both high breakdown voltage and low on-resistance, but in general, there is a trade-off relationship between a breakdown voltage and on-resistance of the device.

Among power field effect transistors (power MOS transistor) having a trench gate, a power MOS transistor having a field plate electrode buried in a trench and having a distribution of an impurity concentration in a direction from the bottom portion side to the upper side of the trench in a drift region where electrons travel is known.

By combining the trench type field plate electrode and the impurity concentration distribution of the drift region, the electric field distribution of the drift region is more uniform, and the trade-off between the breakdown voltage and on-resistance of an active region is improved.

However, when the impurity concentration distribution described above and the termination structure of the related art are combined, since the impurity concentration is constant in the longitudinal direction of the trench in the termination region, there is a problem that the same electric field distribution as the active region may not be obtained and the breakdown voltage of the termination region is decreased.

DESCRIPTION OF THE DRAWINGS

FIGS. 1A and 1B are diagrams showing a semiconductor device according to Embodiment 1.

FIGS. 2A to 2C are diagrams showing an impurity concentration distribution of the semiconductor device and an electric field distribution of an active region according to Embodiment 1.

FIGS. 3A to 3C are diagrams showing an electric field distribution of a termination region of the semiconductor device according to Embodiment 1.

FIGS. 4A to 4C are diagrams showing an electric field distribution of a termination region of a semiconductor device of a comparative example according to Embodiment 1.

FIGS. 7A to 7C are diagrams showing an impurity concentration distribution of the semiconductor device and an electric field distribution of an active region according to Embodiment 2.

FIGS. 9A to 9C are diagrams showing an impurity concentration distribution of the semiconductor device and an electric field distribution of an active region according to Embodiment 3.

FIGS. 10A to 10C are diagrams showing an electric field distribution of a termination region of the semiconductor device according to Embodiment 3.

DETAILED DESCRIPTION

Figure 5A:
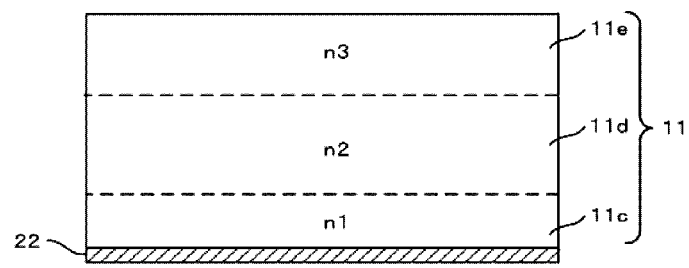
FIGS. 5A to 5C are cross-sectional views sequentially showing a manufacturing process of the semiconductor device according to Embodiment 1.

Embodiments provide a semiconductor device capable of improving a breakdown voltage of a termination region.

In general, according to one embodiment, a semiconductor device includes a semiconductor layer of a first conductivity type that includes a first surface and a second surface opposite to the first surface and has an impurity concentration distribution in a direction from the second surface side to the first surface side, a first semiconductor region of a second conductivity type that is provided at a midpoint between the semiconductor layer and the first surface side, a second semiconductor region of a first conductivity type provided in a midpoint between the first semiconductor region and the first surface side, a first trench that is provided at a midpoint between the semiconductor layer and the first surface side, a first electrode that is provided in the first trench via a first insulating film so as to face the first semiconductor region, a second electrode that is provided in the first trench via a second insulating film, a second trench that is provided at a midpoint between the semiconductor layer and the first surface side so as to surround the first trench, and a third electrode that is provided in the second trench via a third insulating film.

Hereinafter, embodiments of the present disclosure will be described with reference to drawings. In the following description, the same or similar members and the like are denoted by the same reference numerals, and the description of the members and the like once described is omitted as appropriate.

In addition, in the following description, the relative impurity concentrations of the respective conductivity types may be represented by $n^+$, n, $n^-$, $n^{--}$, and $p^+$, p, $p^-$, $p^{--}$. That is, $n^+$ indicates that an n-type impurity concentration is relatively higher than that of n, $n^-$ indicates that the n-type impurity concentration is relatively lower than that of n, and $n^{--}$ indicates that the n-type impurity concentration is relatively lower than that of $n^-$. In addition, $p^+$ indicates that a p-type impurity concentration is relatively higher than that of p, $p^-$ indicates that the p-type impurity concentration is relatively lower than that of p, and $p^{--}$ indicates that the p-type impurity concentration is relatively lower than that of $p^-$. In some cases, $n^+$ type, $n^-$ type, and $n^{--}$ type are simply described as n type, and $p^+$ type, $p^-$ type, and $p^{--}$ type are simply described as p type.

In the present specification, the p-type impurity concentration means a net p-type impurity concentration. The net p-type impurity concentration is the concentration obtained by subtracting an actual n-type impurity concentration from an actual p-type impurity concentration of the semiconductor region. Similarly, in the present specification, the n-type impurity concentration means a net n-type impurity concentration. The net n-type impurity concentration is the concentration obtained by subtracting an actual p-type impurity concentration from an actual n-type impurity concentration of the semiconductor region.

Embodiment 1

In general, according to one embodiment, a semiconductor device includes a semiconductor layer of a first conductivity type having a first surface and a second surface opposite to the first surface and an impurity concentration distribution in a first direction from the second surface to the first surface, a first semiconductor region of a second conductivity located between the semiconductor layer and the first surface, a second semiconductor region of a first conductivity type located between the first semiconductor region and the first surface side, a first trench extending from the first surface into the semiconductor layer, a first electrode located in the first trench over a first insulating film and spaced from the first semiconductor region by a first insulating film, a second electrode located in the first trench over a second insulating film, a second trench extending from the first surface into the semiconductor layer and surrounding the first trench, and a third electrode located in the second trench over a third insulating film.

FIGS. 1A and 1B are diagrams showing a semiconductor device according to the present embodiment, FIG. 1A is a plan view thereof, and FIG. 1B is a cross-sectional view taken along the line A-A of FIG. 1A and viewed in the direction of the arrow.

FIGS. 2A to 2C show an impurity concentration distribution of the semiconductor device and an electric field distribution of an active region, FIG. 2A is the same as FIG. 1B, FIG. 2B is an impurity concentration distribution diagram, and FIG. 2C is an electric field distribution diagram.

FIGS. 3A to 3C are diagrams showing an electric field distribution of a termination region of the semiconductor device, FIG. 3A is an enlarged plan view near the boundary between the active region and the termination region, FIG. 3B is a cross-sectional view taken along line B-B of FIG. 3A and viewed in the direction of the arrow, and FIG. 3C is an electric field distribution diagram.

First, the outline of the semiconductor device will be described.

As shown in FIGS. 1A and 1B, a semiconductor device 10 of the present embodiment is a vertical power MOS transistor having a trench gate and a field plate electrode buried in the trench.

The semiconductor device 10 includes an active region 10a and a termination region 10b surrounding the active region 10a. The active region 10a functions as a region through which a current flows when the semiconductor device 10 is turned on. The termination region 10b functions as a region for balancing the electric field applied to the end portion of the active region 10a when the semiconductor device 10 is turned off and improving the breakdown voltage of the semiconductor device 10.

In the active region 10a, a plurality of first trenches 14 extending in a first direction (X direction) are provided at a predetermined interval d1 from one another in a second direction (Y direction) orthogonal to the first direction. Each first trench 14 has, for example, a stripe shape. In the termination region 10b, a second trench 19 is disposed so as to surround the plurality of first trenches 14. The second trench 19 has, for example, a frame shape. The distance (interval dx in the X direction and interval dy in the Y direction) between each first trench 14 and the adjacent portion of the second trenches 19 is substantially the same, and is a predetermined interval (d1=dx=dy).

The opposed end portions of each of the first trenches 14 extend beyond the active region 10a and into the adjacent portions of the termination region 10b. FIG. 1A shows a case where six first trenches 14 extend in the active region 10a, but there is no particular limitation on the number of the first trenches 14 extending in the active region 10a.

The semiconductor device 10 is provided with an n-type (first conductivity type) semiconductor layer 11 that includes a first surface 11a and a second surface 11b located opposite to the first surface 11a, and has an impurity concentration distribution in a direction from the second surface 11b side toward the first surface 11a side thereof (Z direction).

The semiconductor layer 11 is provided on a semiconductor substrate 22, and the second surface 11b is in contact with the semiconductor substrate 22. A drain electrode (not shown) is provided on the semiconductor substrate 22. The semiconductor substrate 22 is, for example, a silicon substrate.

A p-type (second conductivity type) p base region (first semiconductor region) 12 is provided between the semiconductor layer 11 and the first surface 11a. An $n^+$ source region (second semiconductor region) 13 is provided between the p base region 12 and the first surface 11a.

The first trench 14 extends from the first surface 11a inwardly of the semiconductor layer 11. A gate electrode (first electrode) 16 is provided in the first trench 14, over a gate insulating film (first insulating film) 15, and faces the p base region 12.

Further, a first field plate electrode (second electrode) 18 is provided in the first trench 14 over a first field plate insulating film (second insulating film) 17.

Here, the gate electrode 16 is surrounded by the first field plate insulating film 17 and the gate insulating film 15 and is physically separated from the first field plate electrode 18.

The second trench 19 extends from the first surface 11a inwardly of the semiconductor layer 11 and surrounds the first trench 14. A second field plate electrode (third electrode) 21 is provided in the second trench 19 over a second field plate insulating film (third insulating film) 20.

An interlayer insulating film 23 is provided on the p base region 12 and the first field plate insulating film 17. A source electrode 24 is provided on the interlayer insulating film 23. The source electrode 24 is connected to the side surface of an $n^+$ source region 13 and the p base region 12 through an opening provided in the interlayer insulating film 23. The first field plate electrode 18 may be connected to the source electrode 24.

There may be a case where the p base region 12 is not provided between the second trench 19 and the adjacent first trench 14.

Next, the breakdown voltage in the active region of the semiconductor device will be described.

As shown in FIG. 2B, in the direction (Z direction) from the second surface 11b side to the first surface 11a side, the semiconductor layer 11 includes a first portion 11c having a first impurity concentration n1, a second portion 11d having a second impurity concentration n2 higher than the first impurity concentration n1, and a third portion 11e having a third impurity concentration n3 equal to the first impurity concentration n1. That is, the semiconductor layer 11 has three levels of impurity concentration distribution represented by n1=n3<n2.

The second portion 11d is provided closer to the second surface 11b side of the semiconductor layer 11 than the gate electrode 16 and closer to the first surface 11a side of the semiconductor layer 11 than the bottom portion of the first trench 14 closest to the semiconductor substrate 22. The third portion 11e is provided closer to the second surface 11b side of the semiconductor layer 11 than the gate electrode 16 and closer to the first surface 11a side of the semiconductor layer 11 than the second portion 11d. The thicknesses of the first portion 11c, the second portion 11d, and the third portion in the third direction may be essentially the same.

The broken line shown in FIG. 2B shows the impurity concentration distribution of the semiconductor device of a comparative example. In the semiconductor device of the comparative example, the impurity concentration distribution is substantially constant.

As shown in FIG. 2C, both the electric field distribution (solid line) of the active region 10a and the electric field distribution (dashed line) of the active region of the comparative example in the present embodiment have electric field peaks at two locations, at the lower end of the gate electrode 16 and at the bottom of the first trench 14 and a lower electric field between the two points, that is, the electric field has a so-called bimodal distribution. Since the breakdown voltage value corresponds to the lowest electric field value, in order to improve the breakdown voltage, it is necessary to increase the value of the electric field between the peak values of the bimodal distribution to make the electric field distribution more uniform.

In the semiconductor layer 11 of the present embodiment, the n-type impurity concentration in the second portion 11d is higher than that in the comparative example. As a result, the drain voltage increases and a punch-through state occurs when a depletion layer reaches the second portion 11d of the semiconductor layer 11 having a high impurity concentration, whereby the electric field is increased as compared with the semiconductor layer of the comparative example. As a result, the breakdown voltage in the active region 10a is improved and the on-resistance of the device is reduced.

The breakdown voltage in the termination region of the semiconductor device will be described.

As shown in FIGS. 3(a) and 3(b), in the termination region 10b of the present embodiment, the frame-shaped second trench 19 is disposed so as to surround the stripe-shaped first trench 14. In the second trench 19, the second field plate electrode 21 is buried over the second field plate insulating film 20. The second field plate electrode 21 may be connected to the source electrode 24 as is the first field plate electrode 18.

Each of the first trench 14 and the second trench 19, the first field plate insulating film 17 and the second field plate insulating film 20, and the first field plate electrode 18 and the second field plate electrode 21 have substantially the same structure. Substantially the same includes not only the structure being completely identical but also the structure is sufficiently similar to the extent that the intended effect of action is obtained.

Specifically, the first trench 14 and the second trench 19 have the same trench width and trench depth. The first field plate insulating film 17 and the second field plate insulating film 20 have the same film composition and thickness. The first field plate electrode 18 and the second field plate electrode 21 have the same film composition.

As a result, the portion of the first trench 14 and the second trench 19 in the termination region 10b have the same structure as the adjacent portion of the first trenches 14 in the active region 10a.

Therefore, as shown in FIG. 3C, since the electric field distribution of the termination region 10b is substantially the same as the electric field distribution of the active region 10a, it is possible to improve the breakdown voltage of the termination region 10b and have it be equal to the breakdown voltage of the active region 10a.

FIGS. 4A to 4C are diagrams showing an electric field distribution of a termination region of the semiconductor device of the comparative example, FIG. 4A is an enlarged plan view near the boundary between the active region and the termination region, FIG. 4B is a cross-sectional view taken along line C-C of FIG. 4A and viewed in the direction of the arrow, and FIG. 4C is an electric field distribution diagram. The semiconductor device of the comparative example is a semiconductor device in which the second trench disposed in the termination region does not surround the first trenches.

As shown in FIGS. 4A and 4B, in a semiconductor device 40 of the comparative example, a second trench 41 is disposed in parallel with the first trench 14 in the termination region 40b. The second trench 41 has a stripe shape like the first trench 14. In the second trench 41, a second field plate electrode 43 is buried over a second field plate insulating film 42.

As shown in FIG. 4C, in the termination region 40b of the semiconductor device 40 of the comparative example, the electric field shows a distribution having a peak in the third portion 11e having a low impurity concentration, that is, a so-called unimodal distribution. Therefore, the electric field distribution is remarkably nonuniform as compared with the bimodal distribution shown by the broken line in FIG. 3C. In the termination region 40b, since the impurity concentration is constant in the longitudinal direction (X direction) of the first trench 14, the breakdown voltage is lower than an active region 40a.

Next, a method of manufacturing the semiconductor device 10 will be described. FIGS. 5A to 6C are cross-sectional views sequentially showing a manufacturing process of the semiconductor device 10.

As shown in FIG. 5A, a semiconductor layer having a predetermined film thickness and a predetermined impurity concentration is continuously epitaxially grown on the semiconductor substrate 22 by, for example, a vapor growth method. Epitaxial growth is performed using, for example, hydrogen ($H_2$) as a carrier gas, dichlorosilane ($SiCl_2H_2$) as a process gas, and phosphine ($PH_3$) as a doping gas. In this manner, the semiconductor layer 11 having the first portion 11c having the first impurity concentration n1, the second portion 11d having the second impurity concentration n2, and the third portion 11e having the third impurity concentration n3 is formed.

Figure 5B:
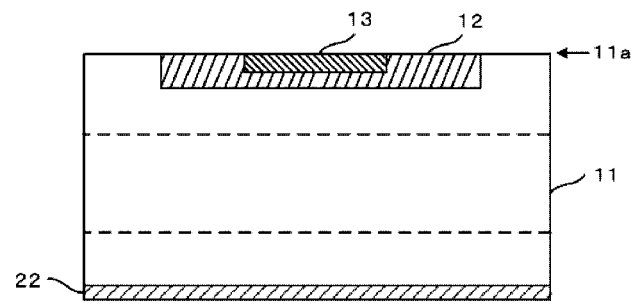

As shown in FIG. 5B, boron ions ($B^+$) are implanted through the first surface 11a and into a predetermined region of the semiconductor layer 11 by ion implantation, for example. In this manner, the p base region 12 is formed inwardly of the semiconductor layer 11 from the first surface 11a.

Next, phosphorus ions ($P^+$) are implanted through the first surface 11a into a predetermined region of the p base region 12. In this manner, the $n^+$ source region 13 is formed in the p base region 12 at and extending inwardly of the semiconductor layer from the first surface 11a. Activation annealing may be performed separately or simultaneously.

Figure 5C:
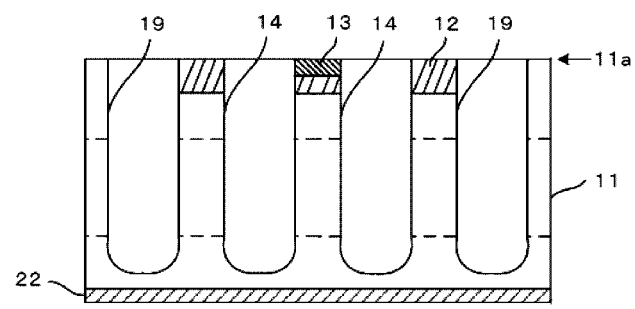

As shown in FIG. 5C, the first trench 14 and the second trench 19 are simultaneously formed in the semiconductor layer 11 into the first surface 11a by photolithography and Reactive Ion Etching (RIE), for example. The first trenches 14 and the second trench 19 have the same width and the same depth.

Figure 6A:
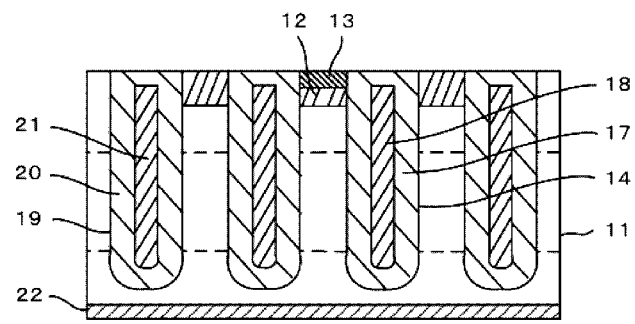
FIGS. 6A to 6C are cross-sectional views sequentially showing a manufacturing process of the semiconductor device according to Embodiment 1.

As shown in FIG. 6A, an insulating film, for example, a silicon oxide film is formed on the inner surfaces of the first trench 14 and the second trench 19 by a Chemical Vapor Deposition (CVD) method, for example, and a conductive film, for example, a polysilicon film is deposited thereover. In this manner, at the same time that the first field plate electrodes 18 are formed in the first trench 14 over the first field plate insulating film 17, the second field plate electrode 21 is formed in the second trench 19 over the second field plate insulating film 20.

Figure 6B:
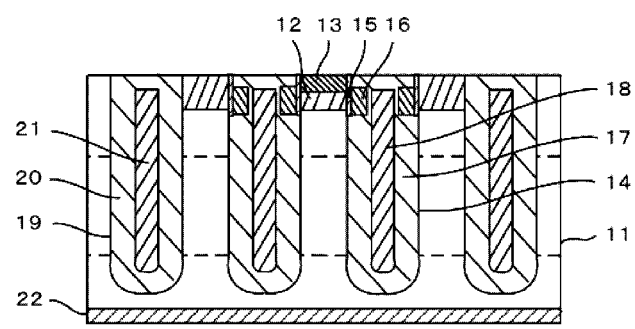

Next, as shown in FIG. 6B, the first field plate insulating film 17 in the first trench 14 is recessed so as to expose the side surface of the p base region 12 by RIE, for example. An insulating film to be the gate insulating film 15, for example a silicon oxide film, is formed on the inner wall of the exposed first trench 14 by a thermal oxidation method, for example, and a conductive film to be the gate electrode 16, for example a polysilicon film, is formed by the CVD method.

Figure 6C:
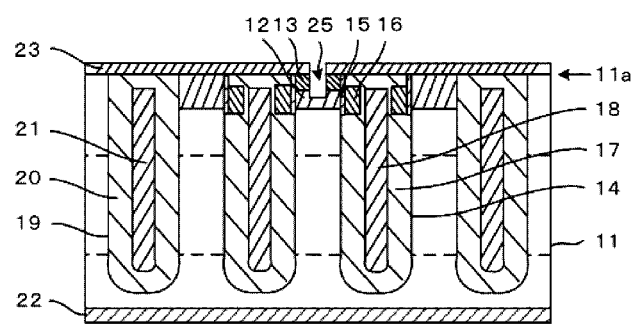

Next, as shown in FIG. 6C, an insulating film to be the interlayer insulating film 23 covering the entire surface of the first surface 11a of the semiconductor layer 11, for example a silicon oxide film, is formed by CVD, for example. A contact hole 25 extending through the n$^+$ source region 13 to the p base region 12 is formed in the interlayer insulating film 23 by RIE, for example.

A metal film to be the source electrode 24, for example an aluminum (Al) film, is formed on the interlayer insulating film 23 so as to fill the contact hole 25 by, for example, sputtering. In this manner, the semiconductor device 10 shown in FIGS. 1A and 1B is obtained.

As described above, in the semiconductor device 10 of the present embodiment, the semiconductor layer 11 has three levels of impurity concentration distribution represented by n1=n3<n2 and the second trenches 19 are arranged in the termination region 10b so as to surround the first trenches 14 of the active region 10a. As a result, even in the termination region 10b, since the arrangement of the first trench 14 and the second trench 19 is equivalent to that of the adjacent first trenches 14 in the active region 10a, it is possible to make the breakdown voltage in the termination region 10b equal to the breakdown voltage in the active region 10a. Therefore, it is possible to obtain a semiconductor device capable of improving the breakdown voltage of the termination region.

Here, the case where the first conductivity type is n type and the second conductivity type is p type has been described, but the first conductivity type may be p type and the second conductivity type may be n type.

The case where the semiconductor substrate 22 is a silicon substrate has been described, but the substrate is not particularly limited. Other semiconductor substrates such as SiC substrates, GaN substrates, and the like may also be used.

Embodiment 2

The semiconductor device according to another embodiment will be described with reference to FIGS. 7A to 7C.

FIGS. 7A to 7C shows an impurity concentration distribution of a semiconductor device and an electric field distribution of an active region, FIG. 7A shows a cross-sectional view of a main part of the semiconductor device as in FIG. 1B, FIG. 7B is an impurity concentration distribution diagram, and FIG. 7C is an electric field distribution diagram.

In the present embodiment, the same reference numerals are given to the same constituent parts as those of the above-described Embodiment 1, and description of the same parts will be omitted, and different parts will be described. The present embodiment is different from Embodiment 1 in that the third impurity concentration n3 is lower than the first impurity concentration n1.

That is, as shown in FIG. 7B, in the semiconductor device of the present embodiment, the semiconductor layer 11 has three levels of impurity concentration distribution represented by n3<n1<n2. The second impurity concentration n2 may be, for example, $5 \times 10^{15}$ cm$^{-3}$ to $1 \times 10^{17}$ cm$^{-3}$. The first impurity concentration n1 may be $1 \times 10^{15}$ cm$^{-3}$ to $1 \times 10^{17}$ cm$^{-3}$. The third impurity concentration n3 may be set to $1 \times 10^{15}$ cm$^{-3}$ to $1 \times 10^{17}$ cm$^{-3}$, in a range lower than the first impurity concentration n1.

As shown in FIG. 7C, since the third impurity concentration n3 is lower than the first impurity concentration n1, the slope of the electric field peak at the end of the gate electrode 16 is reduced, and therefore the decrease of the electric field at the second portion 11d is prevented. It is possible to further improve the breakdown voltage of the active region 10a. The breakdown voltage in the termination region 10b is basically equal to the breakdown voltage of the active region 10a.

As described above, the semiconductor layer 11 of the present embodiment has three levels of impurity concentration distribution represented by n3<n1<n2. As a result, the slope of the electric field peak at the end of the gate electrode 16 becomes small, and the decrease of the electric field at the second portion 11d is prevented. It is possible to further improve the breakdown voltage in the active region 10a and the termination region 10b. Therefore, it is possible to obtain a semiconductor device capable of improving the breakdown voltage of the termination region.

Here, the case where the first impurity concentration n1 is lower than the second impurity concentration n2 in the impurity concentration distribution in which the third impurity concentration n3 is lower than the first impurity concentration n1 has been described, but an impurity concentration distribution in which the first impurity concentration n1 and the second impurity concentration n2 are equal to each other may be used.

Figure 8:
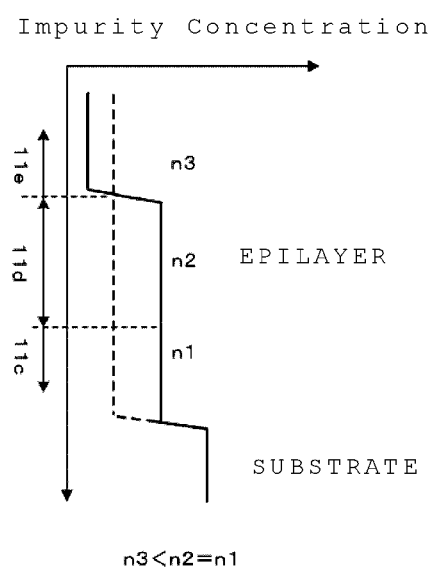
FIG. 8 is a diagram showing another impurity concentration distribution of the semiconductor device according to Embodiment 2.

FIG. 8 is a diagram showing an impurity concentration distribution in which the first impurity concentration n1 and the second impurity concentration n2 are substantially equal and the third impurity concentration n3 is lower than the first impurity concentration n1 (n3<n2=n1).

As shown in FIG. 8, the first impurity concentration n1 is set to $5 \times 10^{15}$ cm$^{-3}$ to $1 \times 10^{17}$ cm$^{-3}$ which is the same as the second impurity concentration n2, and the third impurity concentration n3 is set to $1 \times 10^{15}$ cm$^{-3}$ to $1 \times 10^{17}$ cm$^{-3}$, in a range lower than the first impurity concentration n1. The impurity concentration shown in FIGS. 7A to 7C are so-called three-level impurity concentration distributions, whereas the impurity concentration distribution shown in FIG. 8 is a so-called two-level impurity concentration distribution.

Even with the two-level impurity concentration distribution shown in FIG. 8, it is possible to obtain the effect of the impurity concentration distribution shown in FIG. 2B and the effect of the impurity concentration distribution shown in FIG. 7B. That is, since the electric field distribution becomes flat, improvement of the breakdown voltage is expected. Specifically, as described above, the impurity concentration of the second portion 11d is higher than that of the semiconductor layer of the comparative example. As a result, the drain voltage increases and a punch-through state occurs when a depletion layer reaches the second portion 11d having a high impurity concentration, whereby the electric field is increased as compared with the semiconductor layer of the comparative example. As a result, the breakdown voltage in the active region 10a is improved and the on-resistance is reduced.

Since the third impurity concentration n3 is lower than the first impurity concentration n1, the slope of the electric field peak at the end of the gate electrode 16 is reduced, and therefore the decrease of the electric field at the second portion 11d is prevented. It is possible to further improve the breakdown voltage of the active region 10a.

In addition, in the step shown in FIG. 5A, when epitaxially growing the first portion 11c and the second portion 11d, since the two-level impurity concentration distribution may be maintained constant without changing a doping gas flow rate, there is also an advantage that the process may be simplified.

Embodiment 3

The semiconductor device according to the present embodiment will be described with reference to FIGS. 9A to 10C.

FIGS. 9A to 9C show an impurity concentration distribution of a semiconductor device and an electric field distribution of an active region, FIG. 9A shows a cross-sectional view of a main part of the semiconductor device as in FIG. 1B, FIG. 9B is an impurity concentration distribution diagram, and FIG. 9C is an electric field distribution diagram.

FIGS. 10A to 10C are diagrams showing an electric field distribution of a termination region of the semiconductor device, FIG. 10A is an enlarged plan view near the boundary between the active region and the termination region, FIG. 10B is a cross-sectional view taken along line D-D of FIG. 10A and viewed in the direction of the arrow, and FIG. 10C is an electric field distribution diagram.

In this embodiment, the same reference numerals are given to the same constituent parts as those of the above-described Embodiment 1, description of the parts will be omitted, and different parts will be described. This embodiment is different from Embodiment 1 in that the impurity concentration of the semiconductor layer continually changes in the depth direction of the semiconductor layer.

That is, as shown in FIG. 9B, in the semiconductor device of the present embodiment, the semiconductor layer 11 has a so-called slope-shaped impurity concentration distribution in which the impurity concentration gradually decreases in a direction from the second surface 11b side to the first surface 11a side. In one example, the impurity concentration distribution linearly decreases from an initial value set at $1 \times 10^{17}$ cm$^{-3}$.

As shown in FIG. 9C, the electric field distribution has a steeper slope in the vicinity of the bottom portion of the first trench 14 than in the comparative example. This is because the impurity concentration in the vicinity of the bottom portion of the first trench 14 is higher than the impurity concentration in the comparative example, and therefore the depletion layer hardly elongates.

The breakdown voltage in the active region 10a is basically equal to the breakdown voltage in the active region 10a of Embodiment 1.

As shown in FIGS. 10A to 10C, by providing the second trench 19 surrounding the first trenches 14, the structure in the longitudinal direction (X direction) of the first trench 14 in the termination region 10b is equivalent to that in the active region 10a. The impurity concentration in the longitudinal direction of the first trench 14 is constant, but by adding the second trench 19, the electric field distribution becomes equal to that of the active region 10a. It is possible to improve the breakdown voltage of the termination region 10b.

As described above, in the semiconductor device of the present embodiment, the semiconductor layer 11 has a slope-shaped impurity concentration distribution gradually decreasing in a direction from the second surface 11b side to the first surface 11a side. Also with the slope-shaped impurity concentration distribution, the breakdown voltage of the active region 10a and the termination region 10b is the same as that of Embodiment 1, and the breakdown voltage of the termination region 10b may be improved. Therefore, it is possible to obtain a semiconductor device capable of improving the breakdown voltage of the termination region.

Figure 11:
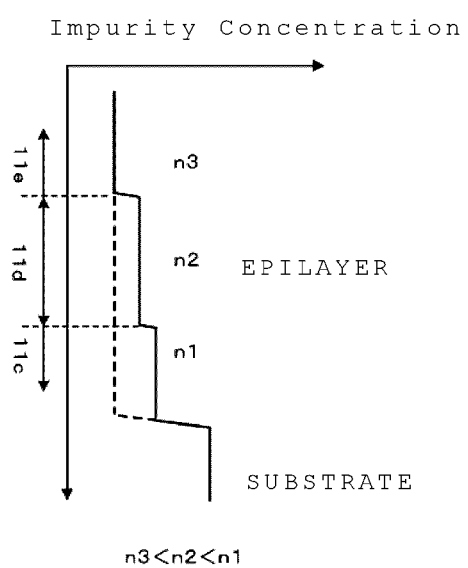
FIG. 11 is a diagram showing another impurity concentration distribution of the semiconductor device according to Embodiment 3.

Here, the case where the continually changing impurity concentration distribution is slope-like is described, but it is also possible to make the inclined impurity concentration distribution stepwise. FIG. 11 is a diagram showing the stepwise declining impurity concentration distribution.

As shown in FIG. 11, when the impurity concentration distribution of the semiconductor layer 11 is stepwise, the second impurity concentration n2 of the second portion 11d is lower than the first impurity concentration n1 of the first portion 11c and the third impurity concentration n3 of the third portion 11e is lower than the second impurity concentration n2 (n3<n2<n1). The first impurity concentration n1 may be set to $1 \times 10^{17}$ cm$^{-3}$, which is the same as the initial value of the slope-like impurity concentration distribution. Even when the declining impurity concentration distribution is stepwise, it is possible to improve the breakdown voltage of the terminal region 10b as in the case of the slope-shaped impurity concentration distribution.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a semiconductor layer having a first surface and a second surface opposite to the first surface, the semiconductor layer including:
   a gradient impurity concentration region of a first conductivity type;
   a first semiconductor region of a second conductivity type located between the gradient impurity concentration region and the first surface;
   a second semiconductor region of the first conductivity type located between the first semiconductor region and the first surface;
   one or more first trenches extending from the first surface into the gradient impurity concentration region; and
   a second trench extending from the first surface into the gradient impurity concentration region and surrounding the first trench;

a first electrode provided in the first trench and surrounded by a first insulating film in the first trench;
a second electrode provided in the first trench and surrounded by a second insulating film in the first trench;
a third electrode provided in the second trench and surrounded by a third insulating film in the second trench, wherein
the gradient impurity concentration region continuously includes a first subregion at a first depth range from the first surface, a second subregion at a second depth range from the first surface that is shallower than the first depth range, and a third subregion at a third depth range from the first surface that is shallower than the second depth range, and
the first subregion has a first impurity concentration, the second subregion has a second impurity concentration, and the third subregion has a third impurity concentration lower than the second impurity concentration.

2. The semiconductor device according to claim 1, wherein the second impurity concentration is higher than the first impurity concentration.

3. The semiconductor device according to claim 2, wherein the first impurity concentration and the third impurity concentration are substantially equal.

4. The semiconductor device according to claim 2, wherein the third impurity concentration is lower than the first impurity concentration.

5. The semiconductor device according to claim 1, wherein the second impurity concentration is substantially equal to the first impurity concentration.

6. The semiconductor device according to claim 1, wherein the second impurity concentration is lower than the first impurity concentration.

7. The semiconductor device according to claim 1, wherein
the semiconductor device includes an active region and a termination region, and
the first trench is provided in the active region, and the second trench is provided in the termination region of the semiconductor device.

8. The semiconductor device according to claim 1, wherein
a plurality of the first trenches extend in a first plane direction and are spaced from one another at a predetermined interval in a second plane direction crossing the first plane direction,
a first part of the second trench extends in the first plane direction along a closest one of the first trenches, and
a distance between the closest one of the first trenches and the first part of the second trench in the second plane direction is substantially equal to the predetermined interval.

9. The semiconductor device according to claim 8, wherein
a second part of the second trench extends in the second plane direction, and
a distance between at least one of the first trenches and the second part of the second trench is equal to the predetermined interval.

10. A semiconductor device, comprising:
a semiconductor layer, the semiconductor layer including:
a gradient impurity concentration region of a first conductivity type;
a first semiconductor region of a second conductivity type located between the gradient impurity concentration region and the first surface;
a second semiconductor region of the first conductivity type located between the first semiconductor region and the first surface;
one or more first trenches extending from the first surface into the gradient impurity concentration region; and
a second trench extending from the first surface into the gradient impurity concentration region and surrounding the first trench;
a first electrode provided in the first trench and surrounded by a first insulating film in the first trench;
a second electrode provided in the first trench and surrounded by a second insulating film in the first trench; and
a third electrode provided in the second trench and surrounded by a third insulating film in the second trench, wherein
an impurity concentration in the gradient impurity concentration region gradually decreases in a depth direction from the first surface toward the second surface.

11. The semiconductor device according to claim 10, wherein the impurity concentration in the gradient impurity concentration region continuously decreases in the depth direction.

12. The semiconductor device according to claim 10, wherein
the semiconductor device includes an active region and a termination region, and
the first trench is provided in the active region, and the second trench is provided in the termination region of the semiconductor device.

13. The semiconductor device according to claim 10, wherein
a plurality of the first trenches are provided, the plurality of the first trenches extending in a first plane direction and being spaced from one another at a predetermined interval in a second plane direction crossing the first plane direction,
a first part of the second trench extends in the first plane direction along a closest one of the first trenches, and
a distance between the closest one of the first trenches and the first part of the second trench in the second plane direction is substantially equal to the predetermined interval.

14. The semiconductor device according to claim 13, wherein
a second part of the second trench extends in the second plane direction, and
a distance between at least one of the first trenches and the second part of the second trench is equal to the predetermined interval.

* * * * *